(12) United States Patent
Matsubara et al.

(10) Patent No.: US 6,642,547 B2
(45) Date of Patent: Nov. 4, 2003

(54) LIGHT EMITTING DEVICE

(75) Inventors: Hideki Matsubara, Osaka (JP); Toshihiko Takebe, Itami (JP); Hiroki Ishinaga, Kyoto (JP); Mamoru Maegawa, Kyoto (JP)

(73) Assignees: Sumitomo Electric Industries, Ltd., Osaka (JP); Rohm Co. Ltd., Kyoto (JP)

( * ) Notice: Subject to any disclaimer, the term of this patent is extended or adjusted under 35 U.S.C. 154(b) by 0 days.

(21) Appl. No.: 10/114,082

(22) Filed: Apr. 1, 2002

(65) Prior Publication Data

US 2003/0008431 A1 Jan. 9, 2003

(30) Foreign Application Priority Data

Mar. 30, 2001 (JP) ........................................ 2001-097844

(51) Int. Cl.[7] .............................................. H01L 29/18
(52) U.S. Cl. .......................................... 257/98; 257/103
(58) Field of Search .................................. 257/98, 103

(56) References Cited

U.S. PATENT DOCUMENTS 6,274,890 B1 * 8/2001 Oshio et al. .................. 257/98
6,337,536 B1 * 1/2002 Matsubara et al. ......... 313/498
6,340,824 B1 * 1/2002 Komoto et al. ............... 257/99

FOREIGN PATENT DOCUMENTS

| JP | 2000 082845 | 3/2000 |
| JP | 2000 150960 | 5/2000 |

* cited by examiner

Primary Examiner—Allan R. Wilson
(74) Attorney, Agent, or Firm—W. F. Fasse; W. G. Fasse

(57) ABSTRACT

The present invention provide a light emitting device including: a resin base having a patterned interconnection; an n-type ZnSe substrate mounted on the resin base; an epitaxial light emission structure formed of a compound crystal relating to ZnSe serving as a matrix, formed on the ZnSe substrate and emitting light when an electric current is applied. A reflector is so constructed and positioned that a spatial distribution of the light emission intensity of the fluorescence light approximates the light emission intensity of the epitaxial light emission structure. The fluorescence light is produced in the ZnSe substrate excited by with the light emission from the epitaxial light emission structure.

5 Claims, 9 Drawing Sheets

E: LIGHT EMISSION FROM EPITAXIAL LIGHT EMISSION STRUCTURE
S: OPTICALLY EXCITED FLUORESCENCE EMISSION FROM SUBSTRATE

E: DIRECTIVITY OF LIGHT EMISSION FROM EPITAXIAL LIGHT EMISSION STRUCTURE
S: DIRECTIVITY OF FLUORESCENT LIGHT EMISSION FROM SUBSTRATE

DIRECTIVITY OF FLUORESCENCE FROM SUBSTRATE WITHOUT REFLECTOR

DIRECTIVITY OF FLUORESCENCE FROM SUBSTRATE WITH REFLECTOR

DIRECTIVITY OF LED WITHOUT REFLECTOR

DIRECTIVITY OF LED WITH REFLECTOR

LIGHT EMITTING DEVICE

BACKGROUND OF THE INVENTION

1. Field of the Invention

The present invention relates generally to light emitting devices in the form of a single semiconductor chip and capable of emitting light of white color, neutral colors between red and blue, i.e., magenta or pink and the like, and particularly to structures improving a spatial distribution of a color of light emitted thereby.

2. Description of the Background Art

As a material for a high bright light emitting diode (LED) a device including a light emitting layer of AlGaAs, GaAsP and the like for red color has been put to practical use and an intensity of no less than several candela (Cd) has been implemented by an inexpensive LED. Other than LEDs for red, GaP for green and yellow-green, GaInN for blue and green, AlGaInP for Mars yellow and yellow have all been put to practical use as inexpensive LEDs.

These LEDs, however, all use a single semiconductor material for their light emitting layers and in principle they can only provide monochromatic light emission. Thus, while typical LEDs are capable of emitting light of a primary color, a color between red and green, and a color between green and blue, such as red, Mars yellow, yellow, yellow-green, green, blue-green, blue, blue-violet and violet, they are incapable of emitting light of a neutral color between red and blue and a neutral color between red, green and blue.

For illumination, decoration and some other similar applications for displaying, a source of light of a color between red and blue (e.g., magenta, pink), a color between red, blue and green (i.e., White), or the like is demanded, rather than a source of monochromatic light as described above. As has been described above, typical LEDs can only achieve a source of monochromatic light, and thus for their source of light a fluorescent lump, an incandescent lamp or the like is used and it has thus suffered short lifetime, large sizes and low luminosity.

In contrast, the present inventors have succeeded in obtaining white light, pink light, magenta light and the like from a single LED using a ZnSe-based homoepitaxial layer formed on a ZnSe substrate, as has been described in Japanese Patent Laying-Open Nos. 2000-82845 and 2000-150960.

A ZnSe substrate which is doped with iodine, aluminum, chlorine, bromine, gallium, indium or the like can provide conductance of n-type, and when it is illuminated with light of shorter than 510 nm, ZnSe can provide a so-called self-activated (SA) luminescence, a broad light emission having a center of an emission wavelength in a range of 550 nm to 650 nm. This light emission appears to be yellow, Mars yellow, or the like.

The central wavelength and the half-width of emission spectrum of SA luminescence can be adjusted by the species, amount or the like of the dopant introduced. Furthermore, a light emission structure of ZnSe used as a matrix can be formed on a ZnSe substrate through homoepitaxy. In this light emission structure, ZnSe or ZnCdSe or ZnSeTe can be used for an active layer to form a high bright LED emitting light at a wavelength from 460 nm to 510 nm for blue color or blue-green color.

FIG. 1 shows a concept of the present LED. In the figure an epitaxial light emission structure provides blue or blue-green light emission, of which that emitted toward the substrate is absorbed by a ZnSe substrate 1 and excites optically SA light emission and thus provides yellow, Mars yellow or red light. The former light emission and the latter light emission can be combined together to obtain emission of light of white, pink, magenta or other similar neutral colors.

In the present LED, however, the emitting point and the spatial distribution of the blue or blue-green emission at the epitaxial light emission structure are different from those of the yellow or Mars yellow light emission (that is, fluorescence) at the ZnSe substrate. Thus depending on the direction of the light radiating from the LED the former light emission and the latter light emission are mixed at different ratios and the resultant light emission varies in color disadvantageously.

So a particular improvement is required to also adjust the ratio in intensity between the former light and the latter light to adjust the color of the light emitted from the LED. These issues are not limited to ZnSe-based LEDs for white color and they are common to ZnSe-based LEDs for pink, magenta and other similar neutral colors, and any multi-color LEDs having a substrate of other materials than ZnSe and which are emitting light by fluorescence.

These issues can be addressed, as described in Japanese Patent Laying-open No. 2000-82845 for example by fixing the epitaxial light emission structure down to a stem (epi-side down configuration) which is a frame of the device, to allow light to be radiated through the substrate. Another example comprises a ZnSe substrate 1 which entirely encloses the device.

These approaches, however, contribute to increased cost and disadvantageously prevent typical LED production lines from being used as they are.

The present LED is also be expected to be applied to displaying in mobile gear, such as a back light of a color liquid crystal display of a cellular phone, an illumination positioned under a key-button thereof, and the like These applications, however, require that a form of a significantly miniaturized surface-mounted LED be implemented at low cost, which is also a significant problem to be addressed.

The present invention has been made to address the above problems. The present invention contemplates a light emitting device producible by a simple and inexpensive process, and emitting light of white, and magenta, pink and other similar neutral colors having a spatially uniform color distribution and provided in various color tones.

The present light emitting device includes: a base having an electrode; a substrate formed of n-type ZnSe single crystal and mounted on the base; an epitaxial light emission structure comprised of a compound crystal relating to ZnSe and serving as a matrix of said light emission structure. The epitaxial light emission structure is secured on the substrate and emits light in response to an electric current passing through the light emission structure. A reflector is provided for correcting the difference in between the spatial distribution of the light emission intensity of the light emitting from the epitaxial structure and the fluorescence light emitting from the substrate.

The reflector scatters the fluorescence from the substrate in a direction of light emitted by the epitaxial light emitting structure. Furthermore the reflector is provided on the base located around the substrate.

Preferably the reflector has an optical reflectance varying to adjust a ratio in intensity between the light emission from the epitaxial light emission structure and the fluorescence from the substrate. Two colors of light can thus be mixed at a varying ratio to obtain a mixture of colors in a desired color tone.

The reflector includes resin of white color, resin having a light scattering medium buried therein, and resin having a surface covered with film of metal, and the base includes a printed circuit board formed of resin and having a patterned interconnection.

The present light emitting device emits light of white color ranging from yellowish white color through bluish white color, or a neutral color including magenta, pink and the like.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS AND OF THE BEST MODE

The present invention is applied to a light emission apparatus having a Surface-mounted LED in a typical LED mounting system allowing an epitaxial light emission structure to face upward, or fixing a substrate to a base having an electrode and serving as a device frame, and it is importantly characterized in that the LED is surrounded by an optical reflector to reflect fluorescence light emitted by the ZnSe substrate in particular for providing a corrected spatial intensity distribution of the light emission.

Figure 1:
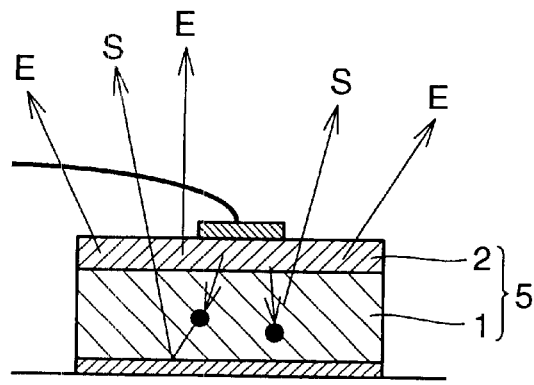
FIG. 1 is a cross section of a multi-color conventional LED having a light emitting substrate.
Figure 2:
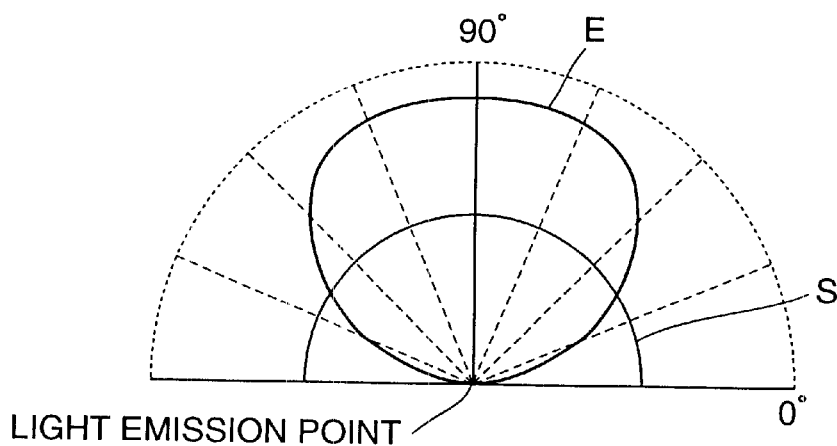
FIG. 2 represents a spatial intensity distribution (E) of light emitted from an epitaxial light emission structure including a bare chip of a multi-color LED, and of a substrate emitting light, with a spatial light intensity distribution (S) due to fluorescence of the substrate.

The present invention is applied to a bare chip of a multi-color LED having a substrate emitting light. As shown in FIG. 2, this bare chip provides a difference in a spatial distribution or directivity of the light emission (E) from the epitaxial light emission structure and of the fluorescent light emission (S) from the substrate.

This is attributed to the fact that the light emission from the epitaxial layer, and from a typical LED, is a light emission from a significantly thin layer of an outermost surface of the bare chip, whereas the fluorescence from the substrate is a light emission from the entire chip, i.e., there is a difference in position between the former light emission and the latter light emission.

Figure 3:
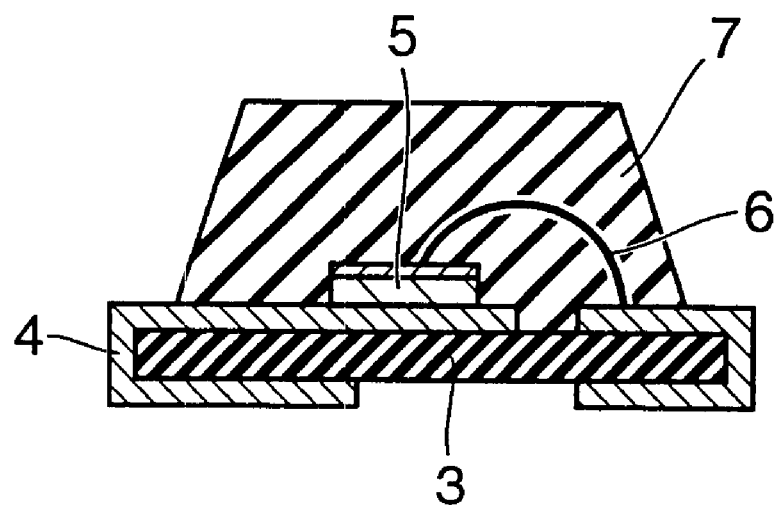
FIG. 3 is a cross section of an example of a structure of a surface-mounted LED sealed with transparent resin.

With this difference in directivity, if a typical, surface-mounted LED mounting method, or molding, is employed, e.g., as shown in FIG. 3, an LED (or chip) 5 mounted on a resin base 3 having a patterned interconnection 4 is sealed with transparent resin 7, then the mounted LED 5 provides light emission having a spatial intensity distribution similar to that of the bare chip. Thus, when seen in different orientations, the two light emissions are mixed at different ratios and the color tone cannot spatially be uniform.

Accordingly it is necessary to control the color tone by such an improvement as described hereinafter to emit light having a uniform spatial color distribution.

More specifically, of two types of light emitted from LED 5, namely the fluorescence light emitted from the ZnSe substrate 1 has its spatial intensity distribution changed by a reflector external to LED 5, so that the fluorescent light emission intensity is close to the light emission intensity from the epitaxial light emission structure 2.

Figure 4A:
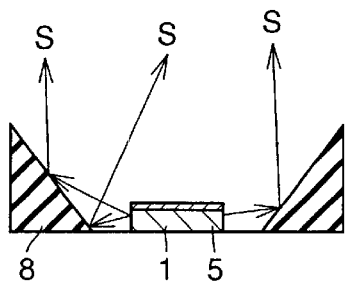
FIG. 4A shows a reflector of the present invention.

More specifically, as shown in FIG. 4A, fluorescence from ZnSe substrate 1 that radiates to a direction parallel to a surface on which LED 5 is mounted is reflected by a reflector 8 formed on resin base 3 to allow the light to radiate in a direction perpendicular to the surface having LED 5 mounted thereon.

Figure 4B:
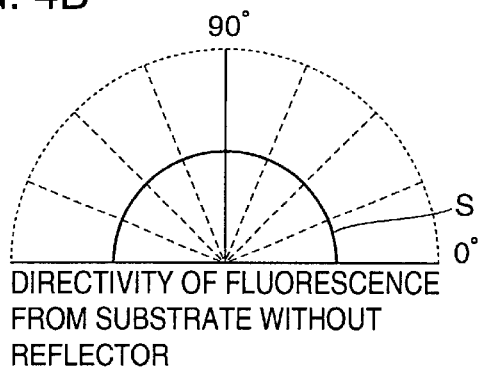
FIG. 4B represents a directivity of fluorescence of a substrate with and without the reflector of FIG. 4A.
Figure 4C:
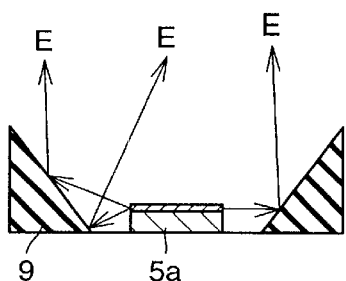
FIG. 4C shows a conventional reflector and FIG. 4D represents a directivity of fluorescence of a substrate with and without the reflector of FIG. 4C.

Thus, as shown in FIG. 4B, the spatial distribution in intensity of fluorescence of ZnSe substrate 1 can be changed to be biased in a direction perpendicular to the surface having LED 5 mounted thereon. As shown in FIG. 2, the spatial distribution of light emission of the epitaxial light emission structure 2 is originally biased in a direction perpendicular to the surface having LED 5 mounted thereon, and the spatial intensity distribution of the fluorescence light of the ZnSe substrate 1 can thus be matched to the light emission intensity of the epitaxial light emission structure 2.

An actually used reflector 8 according to the invention may have an arc-shaped surface, a parabolic-shaped surface or the like, or a flat surface. Furthermore, possible reflector surfaces include a mirror-finished surface, a rough surface for introducing diffusion, or the like. The positional relationship of the reflector 8 with the LED 5 facilitates the design and production of the structure of FIG. 4A.

Reflector 8 can be formed of a highly reflective metal (e.g., a gold-plated copper plate), white resin (e.g., liquid crystal polymer-based resin), resin having a light scattering medium (e.g., titania, silica) distributed to provide an increased optical reflectance, resin having a surface covered with film of metal, or the like.

These can be provided readily as a reflective feature on a printed circuit board, a lead frame and the like that is normally used when a surface-mounted LED is fabricated.

Surface-mounted LED 5 having reflector 8 is similar in geometry to a so-called reflector-type package in a package of a typical, monocolor LED using GaP or the like.

It should be noted, however, that typical reflector-type packages are contemplated mainly to change the direction of light emission to collect light emitted by LED 5 and thus increase the luminosity of LED 5 in an exactly upward direction.

Figure 4D:
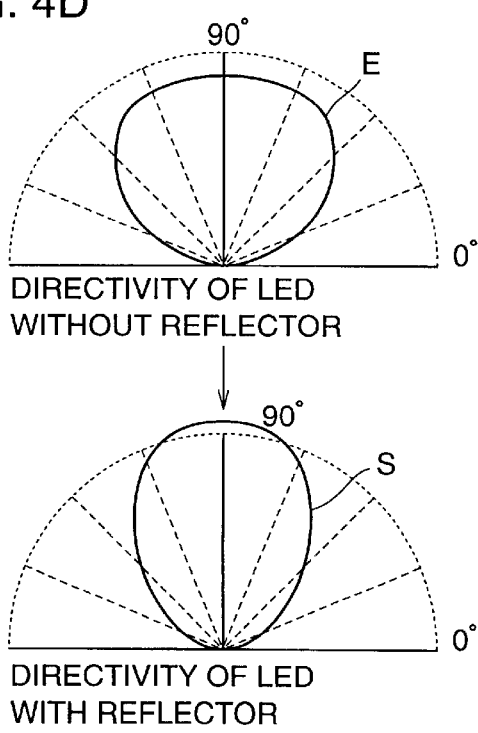

FIGS. 40 and 4D show an example structure of the aforementioned conventional reflector-type package. As shown in the figure, a reflector 9 is provided to increase luminosity. More specifically it had is intended to reflect upwardly the light radiating in a direction parallel to a surface having LED 5a mounted thereon.

Accordingly, the conventional reflector 9 is a paraboloid positioned at a significantly inclined angle, for collimating light received from a point source of light, or the like.

The present invention is distinguished therefrom and contemplates generally matching the spatial intensity distributions of two light emissions radiating in different directions, as described above, to emit a uniform, mixed-color light. Accordingly, reflector 8 for mixing colors has an optimal structure different from that of the typical conventional reflector 9.

As will be described below, the color mixing reflector 8 of the invention has a reflecting surface which is an optimized in structure including for example an arc shaped reflecting surface, a flat reflecting plane forming an angle of 40° to 90° with a plane having the LED 5 mounted thereon, and the like. Furthermore, the reflector 8 may have a wide range of surfaces such as a metallic reflecting surface having a reflectance exceeding 90% to a tinted resin surface having a reflectance of only approximately 10%.

Furthermore LED 5 of the present invention is constructed for changing the ratio of the light emission intensity of the epitaxial light emission structure 2 to the fluorescence light emission intensity of the ZnSe substrate 1 to adjust the color of the light mixture i.e., the color of total light emitted by the LED and the substrate.

For example, if the epitaxial light emission structure 2 is a structure having a sharp light emission peak at 485 nm and the substrate 1 is ZnSe doped with iodine (I), then the substrate's fluorescence would be a light emission having a broad peak at 585 nm.

Figure 5:
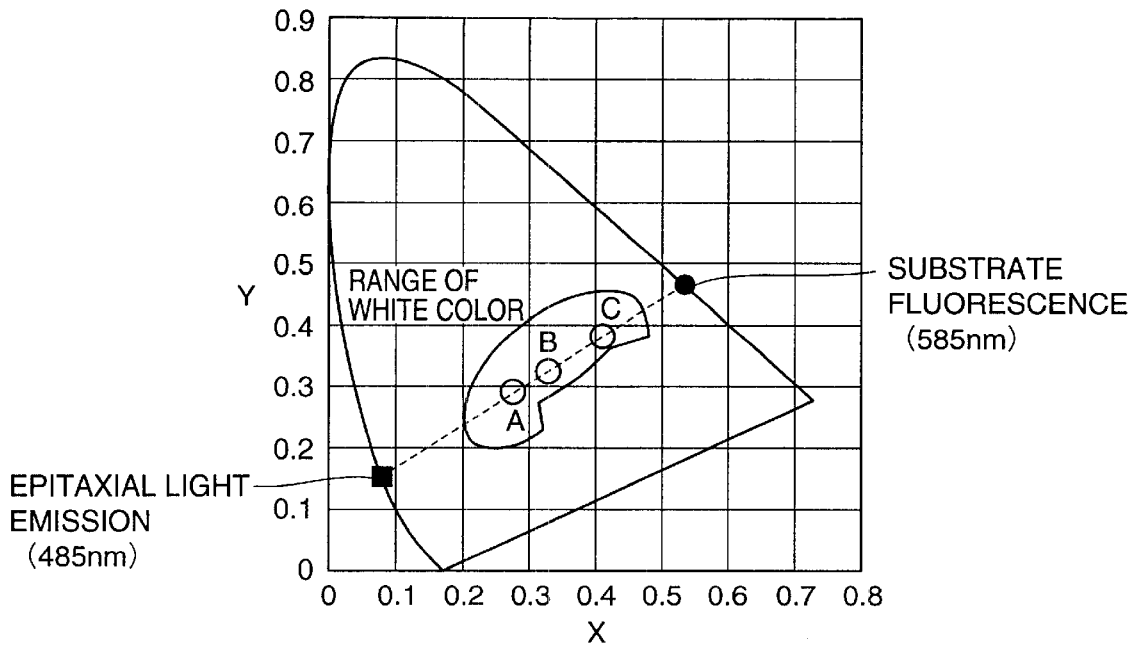
FIG. 5 in shows chromaticity coordinates (X, Y) representing a color of light emitted by an epitaxial light emission structure and a color of fluorescence of a substrate.

The colors of the light emissions of the both the substrate and the LED are represented by chromaticity coordinates (x, y), as shown in FIG. 5. The epitaxial light emission structure 2 provides a blue light emission indicated by a black square and the ZnSe substrate provides a fluorescence yellow light emission indicated by a black circle and the colors that are mixed together are represented by a point A, B or C on a line connecting the black square and the black circle.

If the blue light emission from epitaxial light emission structure 2 is larger in proportion then a bluish white color, i.e., a cold white color would be provided, as represented by point A,. if the yellow fluorescence from ZnSe substrate 1 is larger in proportion then a yellowish white color, i.e., a warm white color would be provided, as represented by point C. Furthermore, if their levels of intensity are balanced at a ratio then a pure white color would be obtained, as represented by point B.

By changing the thickness of the ZnSe substrate 1 or doping the substrate 1 with dopants of different concentrations and species, a fluorescence light emission can be achieved with different levels of intensity. These techniques allow adjusting the mixture of colors for obtaining light emissions having a variety of color tones.

The emission of fluorescence light by the ZnSe substrate 1 can be adjusted in its intensity not only by changing the original luminosity of the substrate, as described above, but also by changing the efficiency of externally extracting the fluorescence light of the substrate. The latter technique can be as effective as the former described above.

In the present invention if the optical reflectance of the reflector 8 is varied then the fluorescence from the ZnSe substrate 1 varies in intensity, as seen in a radiating direction. The LED 5 light emission can thus be adjusted in color.

Using a reflector 8 having a low optical reflectance e.g., a reflector made of brown resin- results in a reduced amount of fluorescence light emitted by the ZnSe substrate 1, that is reflected in a direction perpendicular to a surface having LED 5 mounted thereon. With this feature a color tone can be achieved based on an epitaxial light emission that is larger in proportion to the fluorescence light emission. For example an LED for white color can be made to emit, a bluish white color.

By contrast, using a reflector 8 having a high optical reflectance e.g., a reflector made of resin covered with a metal film provides a larger fluorescence of light emission by the ZnSe substrate 1. This larger portion is reflected in a direction perpendicular to the surface having LED 5 mounted thereon. Thus, for example a yellowish white color can be generated with an LED for white color if the substrate's fluorescence light emission is larger in proportion to the epitaxial emission of the LED.

If the substrate's fluorescence and the epitaxial light emission can be well balanced in intensity, a color tone as desired, e.g., a pure white color, can be generated and the resultant mixture of light emitted can also have a spatially uniform distribution.

In the present invention, LED 5 does not have any difference from a conventional, surface-mounted LED chip in its geometry and how it is fabricated. Further, it is not necessary to use a mounting structure having an epitaxial layer facing downward, an embedded structure, or the like. As such, an already established, inexpensive technique of fabricating a surface-mounted LED can be applied in the present invention.

Thus a at low cost, surface-mounted LED which emits light in any direction in a uniform tone, can be used in accordance with the invention at low cost for emitting light to appear to have a single tone in whichever direction it may be seen, or for emitting light of white, or magenta, or pink or other similar neutral colors in a variety of color tones Hereinafter the present invention in embodiments will be described with reference to FIGS. 6–11B.

First Embodiment

Figure 6:
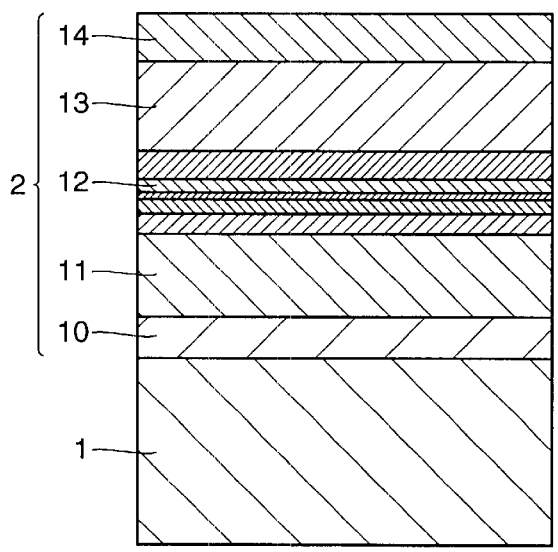
FIG. 6 is a cross section of a ZnSe substrate and epitaxial light emission structure of a LED of the present invention in a first embodiment.
Figure 7A:
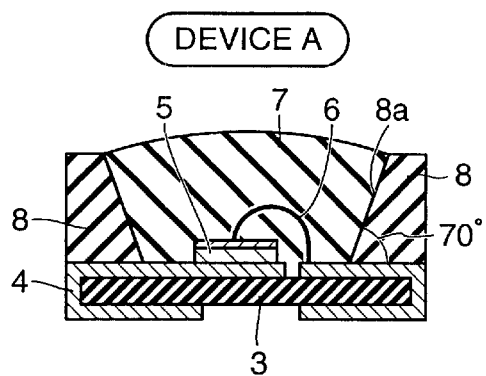
FIGS. 7A–7D are cross sections of LEDs in the first embodiment.
Figure 7B:
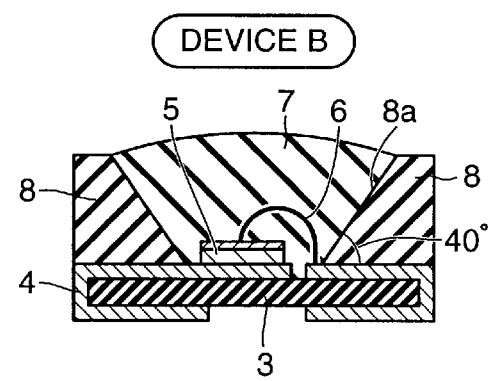
Figure 7C:
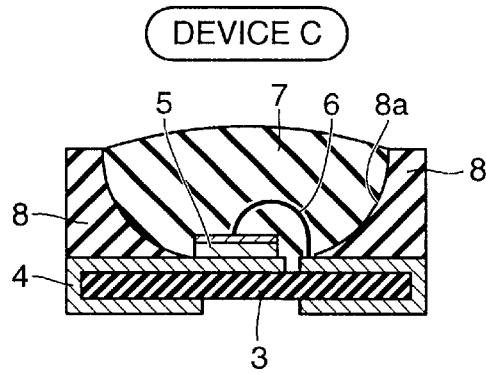
Figure 7D:
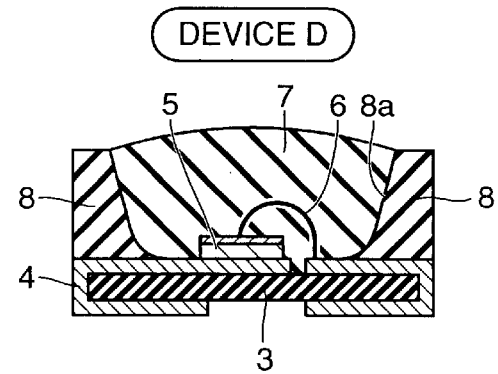
Figure 8B:
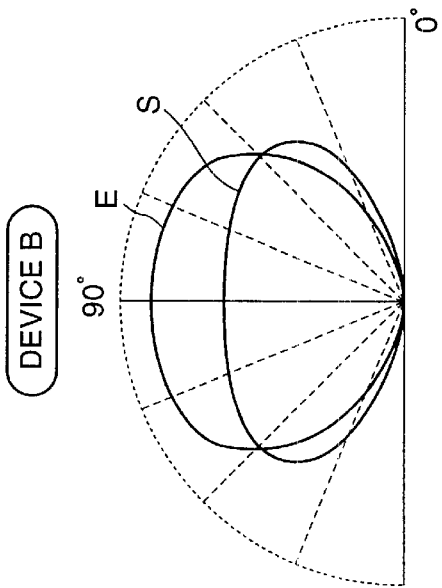
FIGS. 8A–8D each represent a spatial distribution in intensity of light emission of an epitaxial light emission structure and that in intensity of fluorescence of a substrate in a respective one of the FIGS. 7A–7D LEDs.
Figure 8D:
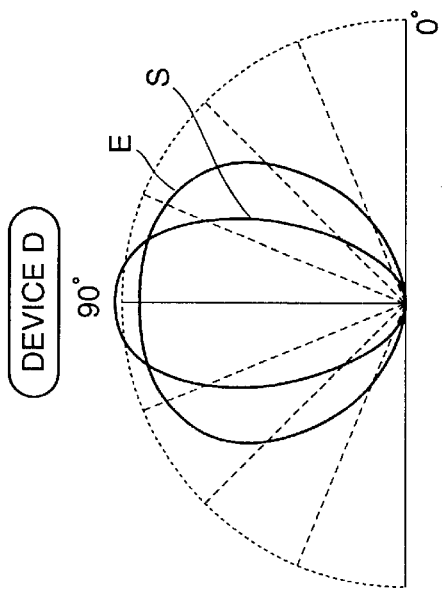
Figure 8A:
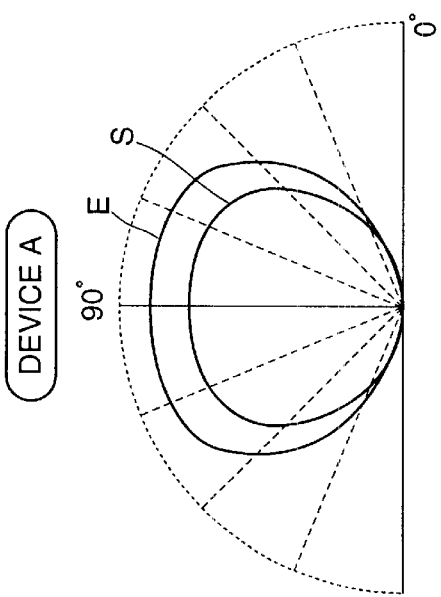
Figure 8C:
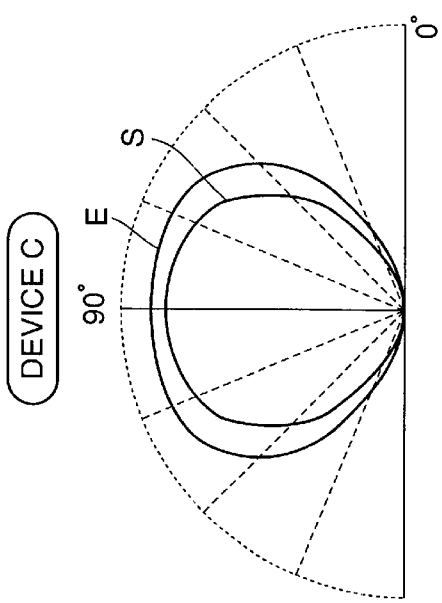

On an iodine-doped, n-type ZnSe substrate 1, an epitaxial light emission structure 2, as shown in FIG. 6, is grown by homoepitaxy with an MBE method for emitting a blue color having a peaked emission wavelength of 485 nm.

The epitaxial light emission structure 2 comprises a p-type contact layer 14 having a superlattice structure of a stack of layers of ZnTe and ZnSe doped to be p-type, a p-type clad layer 13 formed of a layer of $Zn_{0.85}Mg_{0.15}S_{0.10}Se_{0.90}$ doped to be p-type, a single quantum well active layer 12 formed of a structure of a stack of layers of a ZnSe layer and a $Zn_{0.88}Cd_{0.12}Se$ layer, an n-type clad layer 11 formed of a $Zn_{0.85}Mg_{0.15}S_{0.10}Se_{0.90}$ and doped to be n-type, and an n-type ZnSe buffer layer 10.

On the p-type contact layer of an epitaxial wafer; there is formed a patterned, p-type electrode formed of Ti/Au in a lattice, and there is further formed a full-surface covered Au electrode in a thin film of no more than 20 nm in thickness. On the back surface of the substrate an n-type electrode is formed of In.

After the electrode is formed, the epitaxial wafer is cut to form a chip (of type 1) sized to have a surface areas of 400 $\mu m \times 400 \mu m$ and a thickness of 200 m. Furthermore, exactly the same procedure is used to form on an Al-doped ZnSe substrate 1 a structure for a blue color emission having a peaked emission wavelength of 475 nm. The resultant product is also cut to form a chip.

These chips are mounted on a resin base 3 to fabricate four types of surface-mounted LED 5, as shown in FIGS. 7A–7D.

A device A is a simple, flat reflector 8, with a reflecting surface 8a and a surface having LED 5 mounted thereon together forming an angle of 70°. A device B is a similarly flat reflector 8, with a reflecting surface 8a and the surface having LED 5 mounted thereon together forming an angle of 40. A device C is a reflector 8 having an arc-shaped, reflecting surface 8a with a center at the position of an opening located exactly above LED 5. A device P is a reflector 8 having a parabolic reflecting plane 8a with a focus corresponding to the position at which LED 5 is mounted.

Reflector 8 has an opening with an upper end sized to be 1.2 mm and a height of 0.8 mm. Furthermore in the present embodiment on the side of a surface having LED 5 mounted thereon reflector 8 has an opening shaped to be a square.

Reflector 8 is formed of a white, liquid crystal polymer-based resin, and a base with an electrode is formed as a printed circuit board with a resin base 3 formed of BT resin and provided with a patterned interconnection 4 of a structural stack of layers Cu/Ni/Au. The printed circuit board and reflector 8 are stuck together with adhesive to fabricate the LED 5. Since it is a surface-mounted device, the patterned interconnection 4 extends to a back surface of the device or to a back surface of the printed circuit board.

The same effect can be achieved by insert-molding white resin to form the color mixing reflector and the base with the electrode on a lead frame for example of copper- or iron-based metal. Furthermore in the present embodiment the reflector 8 has an opening sealed with transparent resin. e.g. epoxy resin 7.

Initially a surface-mounted type 1 LED 5 was used. An electric current was applied to the epitaxial light emission structure 2 for emitting light. The epitaxial light emission structure 2 generated blue light emission having a peak of 485 nm. The blue light emission was partially absorbed by the ZnSe substrate 1 whereby the substrate emitted yellow fluorescence light having a peak of 585 nm.

The blue light emission and the yellow fluorescence light emission are specially distributed, as shown in FIGS. 8A–8D for devices A–D, respectively.

As shown in FIG. 2, in the bare chip's spatial light emission intensity distribution shows a significant difference between the directivity of a blue light emission E from the epitaxial light emission structure 2 and the directivity of the fluorescence light emission S from the ZnSe substrate 1. Contrary thereto, the device with a color mixing reflector 8, as provided in this first embodiment of the invention has directivities of the respective emissions E and S which are similar to each other, see FIGS. 8A to 8D.

This is because the reflector 8 reflects the substrate's fluorescence that radiates in a direction parallel to the surface having the LED 5 mounted thereon and thus redirects the fluorescent light to radiate in a direction perpendicular to the surface having the LED 5 mounted thereon, whereby the directivity of the fluorescence light has been varied significantly.

The light emission from the epitaxial structure 2 inherently does not have a high intensity in the direction of the reflector 8, and thus the spatial distribution is not significantly changed. In particular for devices A and C the spatial distribution of the light intensity from the epitaxial structure 2 and the light intensity from the substrate 1 substantially match each other. As a result there has been obtained an LED 5 which has a constant color tone in whichever direction it is observed.

These devices provided light emission of a yellowish, warm white color of approximately 4000K in a correlated color temperature. Of these four types of color mixing reflectors 8, device D with a parabolic type configuration is most inferior in that the epitaxial structure 2 light emission and the substrate's fluorescence light emission match each other least in their directivity. Thus, and the problem of mottling is not completely resolved, although the device is brightest in terms of the intensity in an exactly upward direction.

A surface-mounted LED 5 of type 2 was tested by applying an electric current to cause the epitaxial light emission structure 2 to emit light. A blue light emission having a peak of 475 nm was obtained. The blue light emission was partially absorbed by the ZnSe substrate 1 whereby the substrate emitted a Mars yellow fluorescence light having a peak of 610 nm.

The spatial light emission intensity distributions of the type 2 device were examined in the same way as the type 1 device.A. It was found that the directivity of the blue light emission from the epitaxial light emission structure 2 and the directivity Mars yellow fluorescent light emission from the ZnSe substrate 1 match each other best. The type 2 light emitting device provided a uniform color tone in whichever azimuthal direction the light is observed. The device emitted magenta light.

Note that while in the present embodiment, as has been described above, the color mixing reflector 8 has an opening shaped as a square, the present invention is similarly effective if the reflector 8 has an opening shaped for example as a circle or as a rectangle. Furthermore, if the opening is square, rectangular or the like, then a reflector 8 with a pair of color mixing reflector sections having a geometry as seen in a given direction and a different geometry as seen in a direction perpendicular to said given direction can also function as an effective color mixing reflector 8. For example, a color mixing reflector having the cross section of the device A in one direction and the cross section of the device B in a direction perpendicular to said one direction is such an embodiment.

Second Embodiment

A second embodiment will now be described. In the second embodiment of the present invention a chip similar to the type 1 chip used in the first embodiment, was prepared. The present chip was also mounted in a structure having a reflector with having the geometry of the device A used in the first embodiment. It should be noted, however, that the reflector 8 in this second embodiment is formed of a different material and has a surface that is in a different condition than in the first embodiment.

More specifically, a reflector is formed of opaque resin containing titania diffused in the resin is used in a device E. A reflector 8 with a a smooth resin surface plated with gold is used in device F to provide a mirror finished surface. In a device 6 the reflector 8 has a resin surface having small protrusions and depressions which are plated with silver to be provide a moderately glossy 28 reflector surface. The reflectors are mounted, as has been described in the first embodiment.

Figure 9A:
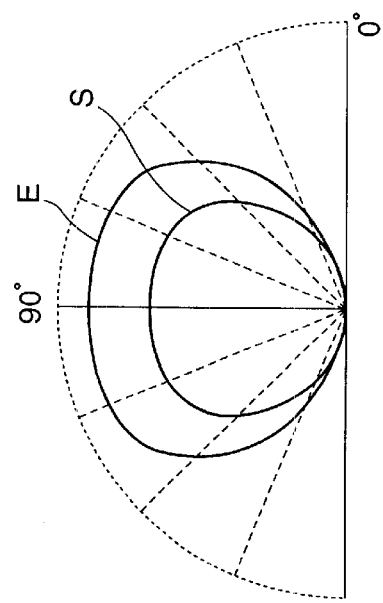
FIGS. 9A–9C respectively represent a spatial distribution of the light emission intensity of an epitaxial light emission structure and the intensity of the fluorescence of a substrate in an LED of a second embodiment of the present invention
Figure 9B:
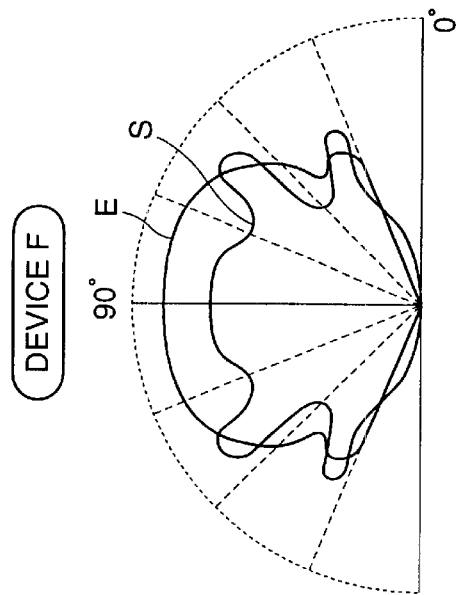
Figure 9C:
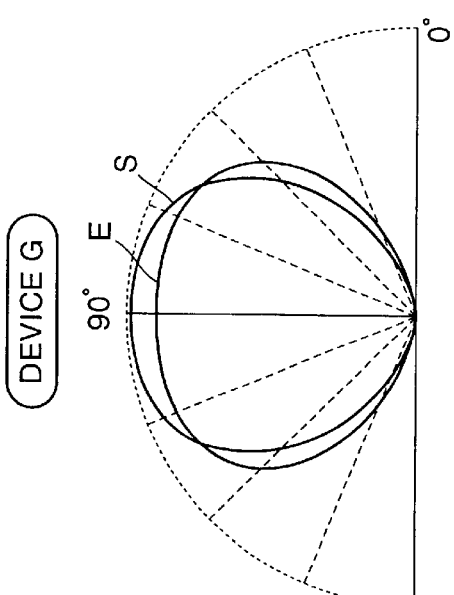

An LED 5 of the second embodiment provides a light emission intensity distribution of blue light emitted by the epitaxial light emission structure 2 and that a yellow fluorescence light emission intensity distribution emitted by the ZnSe substrate 1, as represented in FIGS. 9A–9C. As in the first embodiment, devices E and G provided a blue epitaxial light emission and a yellow fluorescence light emission with substantially matching directivities. Thus, the mixed light of LED 5 was spatially uniform in color.

Furthermore, as can be seen from FIGS. 9A–9C, device G allows the substrate to radiate a fluorescence light emission with a greater intensity than device E and this means that reflector 8 plated with gold has a higher reflectance. Consequently, device G provided white light more yellowish in color tone than device E. It should be noted that device E provided a correlated color temperature of 4500K and device G provided that a color temperature of 3700K.

In device F, by contrast, the substrate provides fluorescence with a spatial profile having protrusions. This is because the reflector 8 has a reflecting surface 8a with a mirror finish whereby several directivity peaks appear in FIG. 9B representing respective light emission paints of LEDs 5.

It can thus be understood that to obtain a spatially uniform light emission intensity distribution reflector 8 preferably has reflecting surface 8a roughened or having protrusions and depressions for providing diffusion.

Third Embodiment

In the third embodiment of the invention, chips of types 1 and 2 identical to those used in the first and second embodiments were prepared. The chip was mounted in a structure having a reflector similar in geometry to device A used in the first embodiment. However, in the third embodiment the reflector 8 was made of a different material and had a different geometry.

Figure 10A:
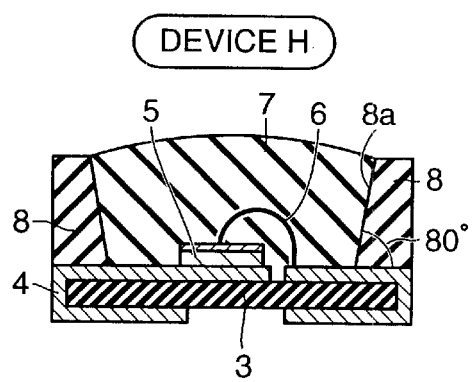
FIGS. 10A and 10B are cross sections of LEDs according to a third embodiment of the present invention.
Figure 10B:
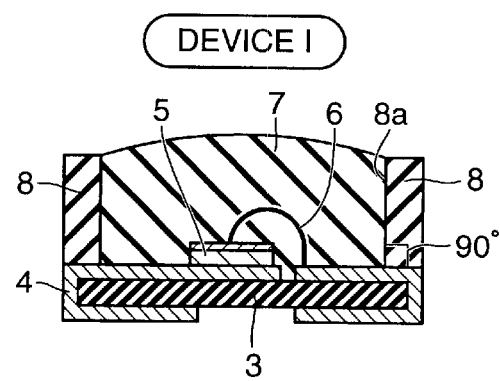

As shown in FIGS. 10A arid 10B, a reflector is formed for a device H of a less reflective, yellow, liquid crystal polymer-based resin. The reflector, has a reflecting surface 8a and an LED 5 mounting surface forming together an angle of 80°, and a reflector for a device is formed of a less reflective, brown, liquid crystal polymer-based resin. The reflector 8 and the surface on which an LED 5 is mounted form an angle of 90°. The mounting is the same as has been described in the first embodiment.

Figure 11A:
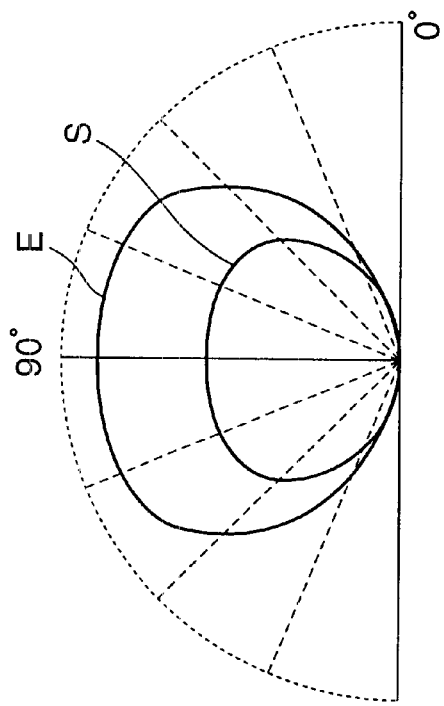
FIGS. 11A and 11B each represent a spatial intensity distribution of the light emission of an epitaxial light emission structure and the intensity of the fluorescence light emission of a substrate in the third embodiment.
Figure 11B:
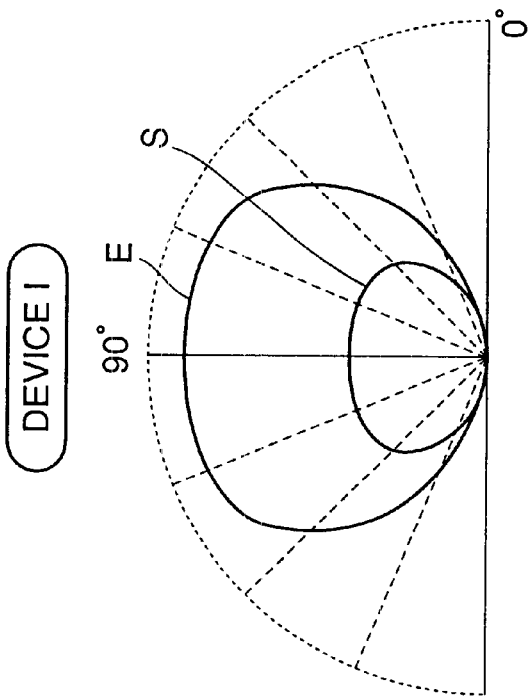

LED 5 used in this third embodiment provided a spatial emission intensity distribution of blue light emitted by the epitaxial light emission structure 2 and an intensity distribution of yellow fluorescence light emitted by the ZnSe substrate 1, as shown in FIGS. 11A and 11B.

The devices H and I both provide a blue light emission and a yellow fluorescence light emission as device A of the first embodiment. The directivities also substantially match each other and the mixed light emitted had a spatially uniform color. Furthermore, as can be understood from FIGS. 11A and 11B, in either device the substrate provides fluorescence light radiated with a smaller intensity than for example the device A of the first embodiment and the device E of the second embodiment. This is attributed to the fact that reflector 8 has a smaller in reflectance than the reflector material of the devices A and E.

The device H with a type 1 chin mounted therein provided substantially pure white color and device I with a type 1 chip mounted therein provided white color light with a bluish color tone. Device H provided a correlated color temperature of 6000K and device I provided a color temperature of 10000K. Furthermore, device H with a type 2 chin mounted thereon and device I with a type 2 chin mounted therein emitted light of a pink color and of a violet color, respectively, both spatially uniform.

In the present invention has provided a reflector and a spatial intensity distribution of the fluorescence light from a substrate that approximates the spatial intensity distribution of the light emission from an epitaxial light emission structure. Thus a light emitting device has been provided which is capable of emitting mixed light in any direction in a uniform color tone with an emission appearance of a single color tone in whichever direction the light may be observed. Furthermore, the substrate having the epitaxial light emission structure can be mounted on a base having an electrode and a conventional surface-mounted LED can be applied to the substrate by any production method. Thus an inexpensive and simple process can be used to fabricate the light emitting device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light emitting device comprising:
   a base having an electrode;
   a substrate formed as an n-type ZnSe single crystal mounted on said base for emitting fluorescent light,
   an epitaxial light emission structure comprising a matrix formed as a compound crystal relating to ZnSe, wherein said epitaxial light emission structure is mounted on said substrate for emitting light when an electric current is passing through said epitaxial light emission structure; and
   a reflector positioned for matching a spatial light emission intensity of said epitaxial light emission structure to a spatial light emission intensity of said fluorescence light from said substrata when said substrate is excited by light emitted from said epitaxial light emission structure, and wherein said reflector has a varying optical reflectance for adjusting an intensity ratio between said light emission from the said epitaxial light emission structure and said fluorescence light emitted from said substrate.

2. The light emitting device of claim 1, wherein said reflector scatters said fluorescence light from said substrate in a direction of light emitted by said epitaxial light emitting device.

3. The light emitting device 9 claim 1, wherein said reflector is secured on said bas positioned around said substrate.

4. The light emitting device of claim 1, constructed for emitting light of a white color ranging from a yellowish white color to a bluish white color, or a neutral color including magenta and pink.

5. A light emitting device comprising:
   a base having an electrode,
   a substrate formed as an n-type ZnSe single crystal mounted on said base for emitting fluorescent light,
   an epitaxial light emission structure comprising a matrix formed as a compound crystal relating to ZnSe, wherein said epitaxial light emission structure is mounted on said substrate for emitting light when an electric current is passing through said epitaxial light emission structure; and
   a reflector positioned for matching a spatial light emission intensity of said epitaxial light emission structure to a spatial light emission intensity of said fluorescence light from said substrate when said substrate is excited by light emitted from said epitaxial light emission structure, and wherein said reflector includes a resin selected from the group consisting of white color resins, resin having a light scattering medium buried therein, and resin having a surface covered with a metal film, and wherein said base includes a printed circuit board formed of resin and having a patterned electrical connecting circuit on said base.

* * * * *

UNITED STATES PATENT AND TRADEMARK OFFICE
CERTIFICATE OF CORRECTION

PATENT NO.   : 6,642,547 B2
DATED        : November 4, 2003
INVENTOR(S)  : Matsubara et al.

It is certified that error appears in the above-identified patent and that said Letters Patent is hereby corrected as shown below:

Title page,
Item [57], ABSTRACT,
Line 11, after "by", delete "with".

Column 1,
Line 38, after "fluorescent", replace "lump" by -- lamp --.

Column 2,
Line 57, after "difference", delete "in";

Column 3,
Line 28, after "light", delete ",";
Line 67, after "having a", replace "Surface-mounted" by -- surface-mounted --;

Column 4,
Line 15, after "layer", delete ",";

Column 5,
Line 12, after "FIGS.", replace "40" by -- 4C --;
Line 15, after "it", delete "had";
Line 53, after "substrate", insert -- 1 --;
Line 60, before "the", replace "point A,. if" by -- point A. If --;

Column 6,
Line 16, after "resin", delete "-";
Line 17, after "1", delete ",";
Line 23, after "emit", delete ",";
Line 47, after "a", delete "at";
Line 52, after "tones", insert -- . --.

Column 7,
Line 4, after "wafer", replace ";" by -- , --;
Line 25, before "A", replace "40." by -- 40º. --;
Line 27, after "device", replace "P" by -- D --.
Line 60, before "distributed", replace "specially" by -- spatially --;

Column 8,
Line 41, after "directivity", insert -- of --;
Line 67, after "reflector", delete "with";

UNITED STATES PATENT AND TRADEMARK OFFICE
CERTIFICATE OF CORRECTION

PATENT NO. : 6,642,547 B2
DATED : November 4, 2003
INVENTOR(S) : Matsubara et al.

It is certified that error appears in the above-identified patent and that said Letters Patent is hereby corrected as shown below:

Column 9,
Line 5, after "reflector", delete "is";
Line 7, after "with", delete "a" ($2^{nd}$ occurrence);
Line 9, after "device", replace "6" by -- G --;
Line 11, before "provide", delete "be", after "glossy", delete "28";
Line 35, after "emission", replace "paints" by -- points --;

Column 10,
Lines 15 and 16, after "type 2", replace "chin" by -- chip --;
Line 19, before "present", replace "In the" by -- The --;
Line 65, after "device", replace "9" by -- of --;
Line 66, before "positioned", replace "bas" by -- base --.

Signed and Sealed this

Twentieth Day of January, 2004

JON W. DUDAS
*Acting Director of the United States Patent and Trademark Office*